United States Patent [19]
Andoh et al.

[11] 3,939,454
[45] Feb. 17, 1976

[54] GAS DISCHARGE PANEL INFORMATION READ-OUT SYSTEM

[75] Inventors: Shizuo Andoh, Kobe; Kenji Murase, Kakogawa, both of Japan

[73] Assignee: Fujitsu Limited, Kawasaki, Japan

[22] Filed: July 30, 1974

[21] Appl. No.: 493,124

[30] Foreign Application Priority Data
Aug. 3, 1973   Japan.............................. 48-87404

[52] U.S. Cl. .... 340/173 PL; 315/169 R; 340/324 M
[51] Int. Cl.² ..................... G11C 7/00; G11C 11/28
[58] Field of Search.... 340/173 R, 173 PL, 173 CR, 340/324 R, 324 M; 315/169 TV, 169 R

[56] References Cited
UNITED STATES PATENTS

| | | | |
|---|---|---|---|
| 3,689,912 | 9/1972 | Dick............................. | 340/173 PL |
| 3,761,897 | 9/1973 | Tech............................ | 340/173 PL |
| 3,763,476 | 10/1973 | Wilson et al. ................ | 340/173 CR |

OTHER PUBLICATIONS
Brown et al., Gas Discharge Display, IBM Technical Disclosure Bulletin, Vol. 15, No. 7, 12/72, pp. 2225–2227.
Hoffman, A Selection System for a Gas Discharge Display Panel, IEEE Transactions on Electron Devices, 9/71, pp. 792–797, S 1520 0041.

*Primary Examiner*—Stuart N. Hecker
*Attorney, Agent, or Firm*—Staas & Halsey

[57] ABSTRACT

A system for reading out information in a plasma display memory panel having a set of X and a set of Y electrodes is disclosed in which a forward current is conducted through unidirectional conducting devices having a charge storage effect, for example, charge storage diodes, connected to the X or Y electrodes; a read voltage is applied to one of a selected one of the Y sets of and X electrodes; a charging current due to the read voltage is conducted through the charge storage diodes in a backward direction making use of their backward recovery time; a gas discharge current, after the charging current terminates, flows in the stray capacitance of the selected X or Y electrode, raising its potential relative to the ground potential; and the potential rise is detected to thereby effect read-out of the information.

5 Claims, 4 Drawing Figures

3,939,454

GAS DISCHARGE PANEL INFORMATION READ-OUT SYSTEM

BACKGROUND OF THE INVENTION

1. Field of the Invention

This invention relates to a gas discharge panel information read-out system, and more particularly to a system for reading out information in a gas discharge panel by detection of current flowing in discharge cells of the panel.

2. Description of the Prior Art

A gas discharge panel commonly referred to as a plasma display memory panel has heretofore been developed as an information display device. As is well-known in the art, the gas discharge panel has such a construction that electrodes arranged in a matrix form facing towards a gas discharge space are covered with a thin dielectric layer thereby to be insulated from the discharge gas. It is also well-known that the gas discharge panel is driven with an AC voltage and that, at a discharge point where a discharge is once produced in accordance with input information, the information is stored in the form of a wall charge. Accordingly, the gas discharge panel can be used not only as a display device but also as a memory device. In the case of employing the gas discharge panel of this kind as a display terminal of a graphic display system, it is necessary to read out information being displayed, since a high value is set on man-machine communication.

A variety of systems have been proposed for reading out the content of a display on the plasma display memory panel. For example, FIG. 1 shows one of them. In the plasma display memory panel indicated generally by PDM in FIG. 1, discharge cells are formed at intersecting points of electrodes $y1$ to $yn$ and electrodes $x1$ to $xm$; an alternating sustain voltage is applied to each discharge cell through the electrodes $Y1$ to $yn$ and $X1$ to $Xm$; and a discharge spot is produced in the discharge cell supplied with a write voltage. In the case of reading out the firing cell, i.e., a cell undergoing discharge, and thus at which the discharge spot is produced, for example, in the case of reading out a firing cell at the intersecting point of the electrodes $y1$ and $x1$, a terminal $Y1$ is grounded and a positive read voltage is applied to the electrode $x1$. At this time, the impedance of a saturable reactor L is held low and the electrode $y1$ is grounded through a diode D2 and the reactor L at terminal $Y1$.

If the read voltage is such as indicated by V in FIG. 2, a current flowing in the electrode $y1$ is as indicated by I. Since the discharge cell is a capacitive load, a charging current Ic flows at an early stage of rise of the voltage V and then a gas discharge current Ig flows when the voltage V has sufficiently risen up to its predetermined level. Further, a small backward discharge current Id flows at an instant of fall of the voltage V. This charging current Ic flows in all of the discharge cells regardless of whether they are firing or non-firing cells, and the gas discharge current Ig flows only in the firing cell, so that read-out is achieved by detecting the gas discharge current Ig.

To this end, the reactor L is controlled to increase its impedance at an instant when the gas discharge current Ig flows after flowing of the charging current Ic, thereby to cut off a current flowing in the diode D2. Consequently, since a diode D1 is connected in a backward direction, the gas discharge current Ig flows in a stray capacitance of the electrode $y1$ to raise its potential relative to the ground potential and the potential change is amplified by an amplifier AMP1 to derive a read-out output at a terminal YR1.

Assuming that the aforementioned charging current Ic starts to flow at an instant $t0$, reaches its maximum value at an instant $t1$ and then becomes substantially zero at an instant $t2$ and that the gas discharge current Ig flows following the charging current Ic and reaches its maximum value at an instant $t3$, it is necessary to control the reactor L at the instant $t2$ to cut off the current flowing in the diode D2. Since the time interval between $t0$ to $t2$ is as short as about less than $0.5\mu S$, control of the reactor L is difficult. Such timing control is also subject to the influence of the characteristics of the discharge cells and the rise-up, or leading edge characteristic of the read voltage, and hence is further difficult, introducing possibilities of inaccurate read-out.

SUMMARY OF THE INVENTION

This invention comprises a gas discharge panel information read-out system which is free from the aforementioned defect of the prior art and in which such timing control as mentioned above is achieved by making use of the backward recovery time of a charge storage diode to thereby facilitate read-out of information.

To attain the above object, the system of this invention is characterized in that when display information of a gas discharge panel having X and Y electrodes is read out, a forward current is conducted through unidirectional conducting devices having a charge storage effect, for example, charge storage diodes, connected with the X or Y electrodes; a read voltage is applied to a selected one of the Y or X electrodes; a charging current flowing due to the read voltage is conducted through the unidirectional conducting devices in a backward direction, utilizing their backward recovery time; a gas discharge current, flowing after the charging current, is conducted in the stray capacitance of the selected X or Y electrode to change its potential relative to a reference potential; and the potential change is detected to thereby achieve read-out of the display information.

Other objects, features and advantages of this invention will become more apparent from the following description taken in conjunction with the accompanying drawings.

DESCRIPTION OF THE PREFERRED EMBODIMENTS

Figure 3:
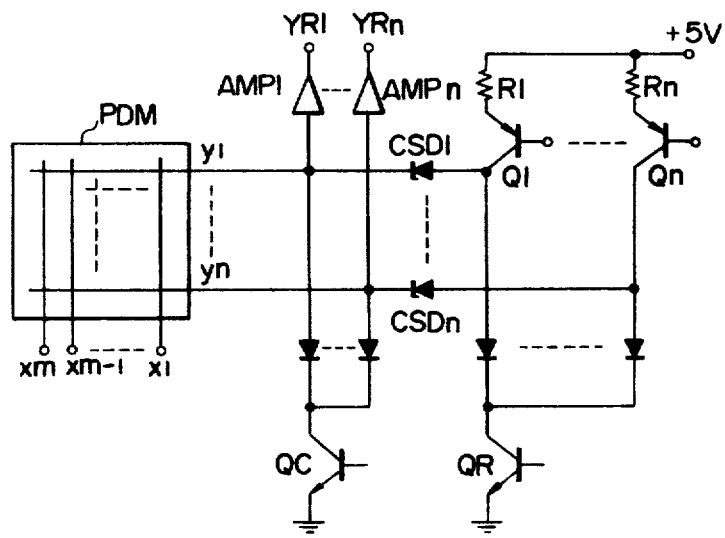
FIG. 3 is a circuit diagram showing the principal part of one embodiment of this invention.

In FIG. 3, there is illustrated a circuit diagram of the principal part of one embodiment of this invention. Reference character PDM indicates a plasma display memory panel; $y1$ to $yn$ and $x1$ to $xm$ designate its electrodes; AMP1 to AMPn identify amplifiers; CSD1 to CSDn denote unidirectional conducting devices connected to corresponding electrodes Y1 to Yn, each having a charge storage effect, for example, charge storage diodes; R1 to Rn represent resistors; and Q1 to Qn, QC and QR show transistors. The transistor QC is turned on at the time of applying a voltage to the electrodes x1 to xm except during read-out, thereby clamping the electrodes y1 to yn at the ground potential. The charge storage diodes employed may be ordinary diodes having a charge storage effect and can also be easily selected from diodes for relatively low-frequency use on the market.

During read-out, the transistors QC and Q1 to Qn are turned on thereby to conduct a forward current in the charge storage diodes CSD1 to CSDn. This current, as to its level or amplitude and the time during which it flows, are selected so that the amount of charge stored in each of the charge storage diodes CSD1 to CSDn corresponds to the charging current Ic shown in FIG. 2. The current level can be set by the resistors R1 to Rn.

Then, the transistors QC and Q1 to Qn are turned off and, at the same time, the transistor QR is turned on and a read voltage is applied to a selected one of the electrodes x1 to xm, for example, x1. The waveform of this read voltage can be made identical with that of a sustain voltage.

Figure 1:
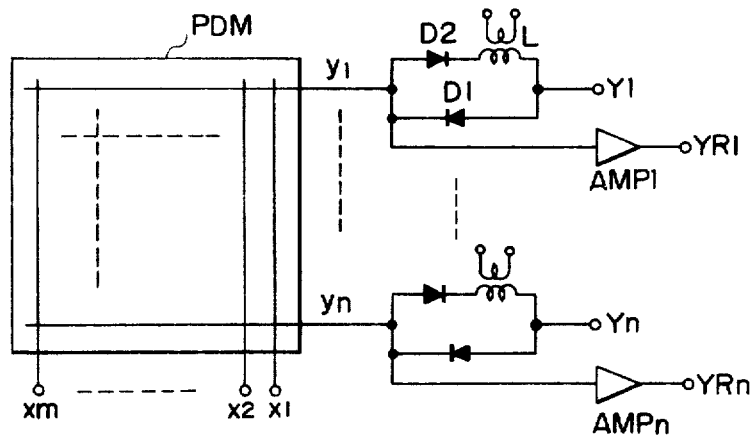
FIG. 1 is a circuit diagram showing the principal part of a conventional plasma display memory panel.
Figure 2:
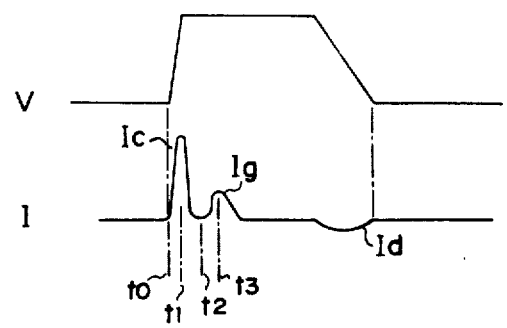
FIG. 2 shows waveforms, for explaining the relation between a read voltage and currents.

With the application of the read voltage, the charging current Ic depicted in FIG. 2 flows through the electrodes y1 to yn, the charge storage diodes CSD1 to CSDn and the transistor QR. At this time, the current flowing in the charge storage diodes CSD1 to CSDn is backward and since the backward conducting time interval of the charge storage diodes is dependent upon the amount of the aforesaid forward current and the resulting amount of charge stored therein, the amount of the forward current is selected so that the charge storage diodes are held in their backward conducting state until the charging current Ic stops flowing.

With respect to the gas discharge current Ig which flows after flowing of the charging current Ic, the charge storage diodes CSD1 to CSDn are in their off state. Accordingly, assuming that the discharge cell at the intersecting point of the electrodes, for example, y1 and x1 is a firing cell, the potential of the electrode y1 rises several volts relative to a reference potential, i.e., the ground potential, corresponding to flowing of the gas discharge current Ig into the stray capacitance of the electrode Y1. The gas discharge current does not flow in the non-firing cells, so that the potentials of the electrodes Y2 to Yn for this example, corresponding to the non-firing cells, remain equal to the ground potential. Such potential changes of the electrodes y1 to yn are amplified by the amplifiers AMP1 to AMPn and read-out outputs are derived at the respective output terminals YR1 to YRn corresponding to the potential rises.

Figure 4:
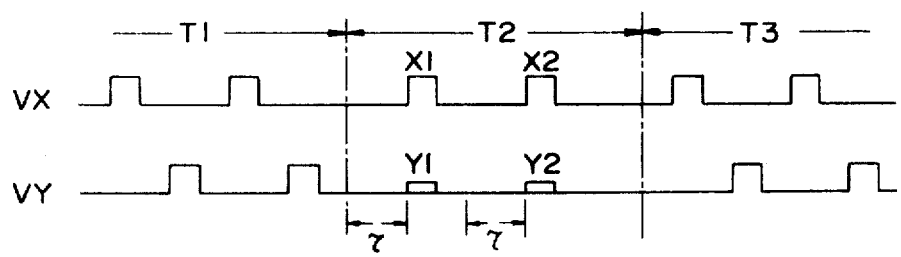
FIG. 4 is a waveform diagram, for explaining voltages to be applied to electrodes.

FIG. 4 is a waveform diagram, for explaining the operation described above. Reference characters VX and VY indicate voltages to be applied to the electrodes x1 to xn and y1 to yn, respectively. In the period T1, the voltages VX and VY are alternately applied to the electrodes x1 to xn and y1 to yn, respectively, to sustain a display. The period T2 is a read-out period. Reference characters X1 and X2 indicate read voltages to be applied to the electrodes x1 and x2, respectively and τ shows the period of time during which the forward current flows in the charge storage diodes CSD1 to CSDn. The period T3 is also a display period as is the case with the period T1. The current I depicted in FIG. 2 flows due to the read voltage in the read-out period T2 and the charging current Ic flows in the backward direction during the backward recovery time of the charge storage diodes CSD1 to CSDn and the gas discharge current Ig raises the potentials of the electrodes y1 to yn as indicated by Y1 and Y2, since the charge storage diodes CSD1 to CSDn are turned off. By detecting the potential rise, read-out can be achieved.

As has been described in the foregoing, in the present invention, when the plasma display memory panel is read out, the timing for the detection of the gas discharge current Ig due to the fact that the charging current Ic and the gas discharge current Ig are close in time to each other is based on the backward recovery time of unidirectional conducting devices having a charge storage effect, for example, charge storage diodes, so that such a timing control as in the prior art is not required and a read-out control is simple. Further, since a saturable reactor or the like is not used, the circuit construction can be reduced in size, and the read-out is not affected by detection of light, and hence is not affected by surrounding light. Thus, accurate read-out can be achieved.

It will be apparent that many modifications and variations may be effected without departing from the scope of the novel concepts of this invention.

What is claimed is:

1. A method for reading out information from a gas discharge panel having first and second sets of plural electrodes each, each said set being covered with an insulating layer and disposed in spaced relation from the other to define a gas discharge space therebetween and containing a gaseous medium within the said space, the electrodes of said first and second sets being disposed to intersect one another and thereby define discharge cells at the respective intersections of individual electrodes of said first and second sets and including a plurality of unidirectional conducting devices connected in circuit with respectively associated ones of said electrodes of said first set, information being stored in said panel as selectively established discharges in said cells and producing a wall charge in association with each information storing cell, said method comprising producing a forward current flow in each of said unidirectional conducting devices to store an electric charge in each thereof, applying a read voltage to each of said electrodes of said first set to produce a gas discharge in said cells and to cause a charging current to flow in the electrodes of said first set in a backward direction through said unidirectional conducting charge storage devices and of a level in accordance with the backward recovery time of the unidirectional conducting charge storage devices to terminate further backward conduction thereof, an information storing discharge cell, following the termination of the backward direction charging current, producing a gas discharge current in accordance with the wall charge therein and causing a potential change in the electrode of said first set associated with the said information storing discharge cell, and detecting selectively, a potential change of an electrode of said first set occurring due to the gas discharge current thereby to read out the information stored in an information storing discharge cell associated with the said electrode of said first set.

2. A system for reading out information stored in a gas discharge panel comprising first and second sets of electrodes, the electrodes of each set being covered by an insulating layer and spaced apart from each other to define a gas discharge space therebetween and arranged in intersecting relationship to define at the points of intersection of an electrode of each of said sets a corresponding gas discharge cell, information being stored in said panel as selectively established discharges in said cells said system for reading out information comprising:

a plurality of unidirectional conducting, charge storage devices each connected to at least one of the electrodes of said first set;

means for supplying a forward current to each of said unidirectional conducting, charge storing devices to store an electric charge in each thereof;

means for supplying a read voltage to each of said electrodes of said second set to produce a gas discharge in said cells of said panel and to cause a charging current to flow in the electrodes of said first set and in a backward direction through said unidirectional conducting charge storage devices, said backward direction charging current being of a level in accordance with the backward recovery time of said devices to terminate further backward conduction thereof, an information storing discharge cell, following termination of the backward direction charging current, producing a gas discharge current in accordance with the wall charge storage therein and causing a potential change in the electrode of said first set associated with the said information storing discharge cell; and means connected to at least one of the electrodes of said first set for detecting a potential change in the said at least one electrode caused by a gas discharge current in a discharge cell associated with the said at least one electrode.

3. A system as recited in claim 2 wherein said unidirectional conducting charge storage devices comprise charge storage diodes.

4. A system as recited in claim 2 wherein:

said means for supplying a forward current comprises:

a forward current power source terminal and a reference terminal;

a plurality of first transistors connected in common to said power source and at corresponding junctions to respectively associated ones of said unidirectional conducting charge storage devices;

a second transistor connected to said reference terminal, a plurality of diodes connected in common to said second transistor and connected to respectively associated ones of said plurality of unidirectional conducting charge storage devices, said plurality of first transistors, said unidirectional conducting devices, said plurality of diodes, and said second transistor being poled for conduction of current therethrough from said power source and to said reference terminal for developing a said charge in each of said unidirectional conducting devices, and said means for producing charging current to flow in a backward direction comprising:

a second plurality of diodes respectively connected to said corresponding junctions of said plurality of first transistors and the respectively associated unidirectional conducting devices, a third transistor connected in common to said second plurality of diodes, and said second plurality of diodes and said third transistor are poled for conducting the backward current through said unidirectional conducting devices.

5. A system as recited in claim 4 wherein said detecting means comprise amplifiers connected to respectively associated ones of said electrodes of said first set for producing an output corresponding to a change of potential on the respectively associated electrode.

* * * * *